United States Patent
Yamamoto et al.

(10) Patent No.: US 7,833,367 B2
(45) Date of Patent: Nov. 16, 2010

(54) ADHESIVE TAPE CUTTING METHOD AND APPARATUS USING THE SAME

(75) Inventors: Masayuki Yamamoto, Osaka (JP); Masaru Irie, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 247 days.

(21) Appl. No.: 11/907,429

(22) Filed: Oct. 12, 2007

(65) Prior Publication Data
US 2008/0093025 A1 Apr. 24, 2008

(30) Foreign Application Priority Data
Oct. 20, 2006 (JP) ............................ 2006-286533

(51) Int. Cl.
*B32B 38/04* (2006.01)
(52) U.S. Cl. .................. 156/64; 156/350; 156/353; 156/354; 156/355; 156/367; 156/378; 156/379; 156/379.6; 156/510; 156/515; 156/522; 156/523; 156/526; 156/530; 83/72; 83/73; 83/74; 83/76.1; 83/290; 83/524; 82/48
(58) Field of Classification Search ............ 156/64, 156/353, 354, 355, 510, 515, 522, 523, 526, 156/530, 350, 367, 378, 379.6; 83/72, 73, 83/74, 76.1, 290, 524; 82/48
See application file for complete search history.

(56) References Cited

U.S. PATENT DOCUMENTS

| 2,788,070 A * | 4/1957 | Seabury, II et al. ............. 83/524 |
| 2,792,883 A * | 5/1957 | Pokorski ....................... 83/524 |
| 4,653,361 A * | 3/1987 | Zobeli ........................... 82/48 |
| 2003/0133762 A1* | 7/2003 | Yamamoto et al. ........... 406/198 |
| 2005/0081988 A1* | 4/2005 | Yamamoto ................... 156/267 |

FOREIGN PATENT DOCUMENTS

JP 62-174940 A 7/1987

OTHER PUBLICATIONS

Lion Precision, "Eddy-Current Sensors and Inductive Sensors, Noncontact measurement of Displacement", http://www.lionprecision.com/inductive-sensors/index.html.*

* cited by examiner

*Primary Examiner*—Kat Wyrozebski
*Assistant Examiner*—Joshel Rivera
(74) *Attorney, Agent, or Firm*—Cheng Law Group, PLLC

(57) ABSTRACT

A strip-shaped supporting adhesive tape is joined to a ring frame, and then is stuck with a cutter blade such that the cutter blade penetrates the adhesive tape. In a state where a cutting edge of the cutter blade is brought into contact with a tape joined side of the ring frame, thereafter, the adhesive tape is cut along a contour of the ring frame while electric current is fed to each of the cutter blade and the ring frame. Herein, a sensor monitors a conduction status in real time.

4 Claims, 6 Drawing Sheets

(a)

(b)

ADHESIVE TAPE CUTTING METHOD AND APPARATUS USING THE SAME

BACKGROUND OF THE INVENTION (1) Field of the Invention

The present invention relates to an adhesive tape cutting method for cutting, along a contour of a ring frame, a supporting adhesive tape joined to the ring frame so as to allow the ring frame to hold a semiconductor wafer, and an apparatus using the same. In particular, the present invention relates to a technique of detecting a cutting failure about the adhesive tape and cutting the adhesive tape along the ring frame with good accuracy.

(2) Description of the Related Art

A semiconductor wafer (hereinafter, simply referred to as a "wafer") having a front face on which a circuit pattern is formed has been made thinner in thickness by back grinding. The wafer subjected to the back grinding is transported to a mount apparatus. In the mount apparatus, the wafer is joined to and held by a ring frame through a supporting adhesive tape. Herein, a disc-shaped cutter blade capable of rotating freely is pressed against the strip-shaped adhesive tape joined to the ring frame and the wafer positioned at a center of the ring frame; thus, the adhesive tape is cut along a contour of the ring frame (refer to JP-A 62-174940).

In recent years, the ring frame tends to be reused positively. In the ring frame to be reused, occasionally, a groove is formed on a side, at which the adhesive tape is joined, due to the contact with the cutter blade or the side is slightly warped. If an adhesive tape is joined to such a ring frame, a flatness of the adhesive tape can not be kept. Consequently, even in a case where the adhesive tape is cut while a predetermined pressing force is applied to the cutter blade, the cutter blade does not always penetrate the adhesive tape. Thus, there arises a problem of a cutting failure, that is, the cutting blade can not perfectly cut the adhesive tape.

SUMMARY OF THE INVENTION

The present invention has been devised in view of the aforementioned circumstances, and a principal object of the present invention is to provide an adhesive tape cutting method capable of detecting a cutting failure about a supporting adhesive tape which allows a ring frame to hold a semiconductor wafer and cutting the adhesive tape with good accuracy, and an adhesive tape cutting apparatus using the same.

In order to accomplish the aforementioned object, the present invention adopts the following configuration:

A method for cutting a supporting adhesive tape allowing a ring frame to hold a semiconductor wafer, the method comprising the steps of:

feeding electric current to a ring frame made of an electrically conductive material and a cutting member;

allowing the cutting member to penetrate an adhesive tape joined to the ring frame; and cutting the adhesive tape along a contour of the ring frame while establishing electrical conduction by a contact of a tip end of the cutting member with the ring frame.

With the method according to the present invention, upon cutting of a supporting adhesive tape along a contour of a ring frame, electric current is fed to the cutting member which penetrates the adhesive tape to come into contact with the ring frame and the ring frame so as to establish electrical conduction. Accordingly, if there occurs a cutting failure due to erroneous cutting of the adhesive tape, such a cutting failure can be readily detected as a conduction failure.

In the method according to the present invention, preferably, when voltage detected upon cutting of the adhesive tape varies, a force to press the cutting member against the adhesive tape is adjusted to stabilize the detected voltage.

With this method according to the present invention, the occurrence of the cutting failure about the adhesive tape can be prevented. More specifically, if a contact area of the ring frame with the cutting member becomes small, the voltage decreases. Therefore, when the force to press the cutting member against the adhesive tape is adjusted so as to stabilize the detected voltage, the occurrence of the cutting failure about the adhesive tape can be prevented.

Herein, the adhesive tape may be cut as follows in accordance with a shape of the cutter blade.

In a case where the cutting member is a cutter blade tapered toward a tip end, first, a position of the cutter blade is detected by a sensor upon cutting of the adhesive tape, and information about the detected position is stored while being brought into correspondence with a status of the voltage.

Herein, when the voltage varies, the stored positional information is read, and the cutter blade is moved to the position, presses the relevant portion of the adhesive tape, and cuts the adhesive tape.

In a case where the cutting member is a cutter formed into a circular shape, first, a position of the cutter blade is stored while being brought into correspondence with conversion into voltage upon cutting of the adhesive tape.

Herein, when the voltage varies, the stored positional information is read, and the cutter blade presses the relevant portion of the adhesive tape, reciprocates at the position, and cuts the adhesive tape.

In order to accomplish the aforementioned object, the present invention also adopts the following configuration:

An apparatus for cutting a supporting adhesive tape allowing a ring frame to hold a semiconductor wafer, the apparatus comprising:

frame holding means for holding a ring frame;

tape supply means for supplying a strip-shaped supporting adhesive tape toward the ring frame;

joining means for pressing a joining member against a non-adhesive surface of the adhesive tape, allowing the holding means and the joining member to move relatively, and joining the adhesive tape to the ring frame;

a cutting mechanism including a cutting member having a sharp tip end, and cutting the adhesive tape along a contour of the ring frame while bringing the cutting member penetrating the adhesive tape into contact with the ring frame;

electric current feed means for feeding electric current to the ring frame and the cutting member upon cutting of the adhesive tape so as to establish electrical conduction;

detection means for detecting a conduction failure upon cutting of the adhesive tape; and separation means for separating an unnecessary portion of the cut adhesive tape.

With the apparatus according to the present invention, upon cutting of the strip-shaped adhesive tape along the contour of the ring frame, the electric current feed means feeds electric current to the cutting member which penetrates the adhesive tape to come into contact with the ring frame and the ring frame so as to establish electrical conduction. Accordingly, when the detection means detects the conduction status in this state, it is possible to readily detect a cutting failure due to erroneous cutting of the adhesive tape. That is, it is possible to suitably realize the aforementioned method according to the present invention.

Preferably, the detection means detects variation in voltage, and the apparatus further comprises: control means, when the detection means detects the variation in voltage, for adjusting a force to press the cutting member against the adhesive tape so as to stabilize the detected voltage.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to the drawings, hereinafter, description will be given of one embodiment of the present invention.

In this embodiment, as an example, description will be given of an apparatus obtained as follows. That is, an adhesive tape cutting method according to the present invention is applied to a semiconductor wafer mount apparatus for preparing a mount frame in such a manner that a semiconductor wafer is held at a center of a ring frame through a supporting adhesive tape.

Figure 1:
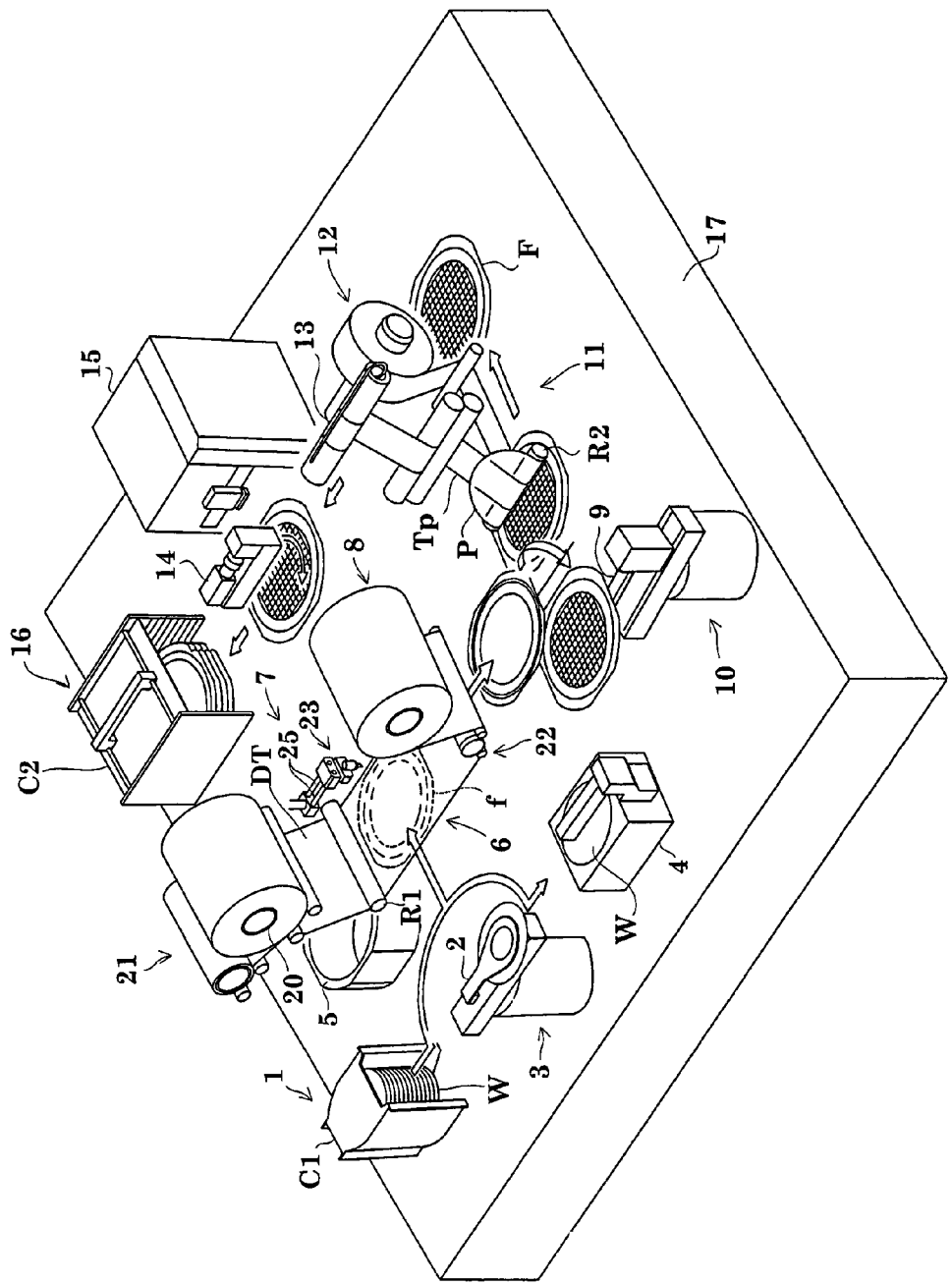
FIG. 1 is a perspective view illustrating a general configuration of a semiconductor wafer mount apparatus according to one embodiment of the present invention.

FIG. 1 is a perspective view illustrating a general configuration of the semiconductor wafer mount apparatus according to this embodiment.

The semiconductor wafer mount apparatus includes: a wafer supply section 1 which includes a cassette C1 for housing semiconductor wafers (hereinafter, simply referred to as "wafers") W, each subjected to a back grinding process, in a stacked manner; a wafer transport mechanism 3 which is equipped with a first robot arm 2; an alignment stage 4 which performs alignment on a wafer W; an alignment stage 5 which performs alignment on a ring frame f; a mount table 6 on which a ring frame f and a wafer W are mounted; a tape processing section 7 which cuts a supporting adhesive tape DT (a dicing tape) joined to a ring frame f and a wafer W to prepare a mount frame F; a tape collection section 8 which collects an unnecessary portion of the cut adhesive tape DT; a transport mechanism 10 which is equipped with a second robot arm 9 for transporting a mount frame F obtained by integration of a wafer W with a ring frame f; a separation mechanism 11 which separates a protective tape P from a pattern face of a wafer W; a separation tape supply section 12 which supplies a separation tape Tp to the separation mechanism 11; a tape collection section 13 which reels and collects the separation tape Tp subjected to processing; a character recognition section 14 which reads a serial number of a wafer W subjected to processing; a printer 15 which joins a barcode label to a mount frame F; a mount frame collection section 16 which includes a cassette C2 for housing mount frames F in a stacked manner; and a base 17.

Herein, the wafer supply section 1, the wafer transport mechanism 3, the alignment stage 4, the alignment stage 5, the mount table 6, the transport mechanism 10, the separation mechanism 11, the character recognition section 14, the printer 15 and the mount frame collection section 16 are disposed on a top side of the base 17. An adhesive tape supply section 21 including a tape joining unit 22 and the like (to be described later) and the tape collection section 8 are slidably disposed on a member (not illustrated) so as to straddle the mount table 6. Moreover, the separation tape supply section 12 for supplying the separation tape Tp and the tape collection section 13 are disposed on a front side of a vertical wall (not illustrated) provided upright on the top side of the base 17.

In the wafer supply section 1, a wafer W to which a protective tape P is joined is directed downward. More specifically, a wafer W is placed on a support plate provided in each stage of the cassette C1 in a horizontal posture in a state where a back face thereof is directed upward. The cassette C1 housing plural wafers W in a stacked manner is placed on a cassette bench. The cassette bench is turnable by an air cylinder (not illustrated) so as to change a direction thereof.

The first robot arm 2 of the wafer transport mechanism 3 is turnable and vertically movable by a drive mechanism (not illustrated). Further, the first robot arm 2 can advance/retreat horizontally. A tip end of the first robot arm 2 is inserted into the wafer supply section 1. Then, the first robot arm 2 suction holds a back face of a wafer W, takes the wafer W out of the wafer supply section 1. Thus, the first robot arm 2 supplies the wafer W to the alignment stage 4, and then supplies the wafer W from the alignment stage 4 to the mount table 6.

The alignment stage 4 performs alignment on a wafer W placed thereon on the basis of an orientation flat or a notch formed at a periphery of the wafer W. Herein, the alignment stage 4 includes a holding table which vacuum sucks the wafer W so as to cover the entire back face of the wafer W.

Figure 2:
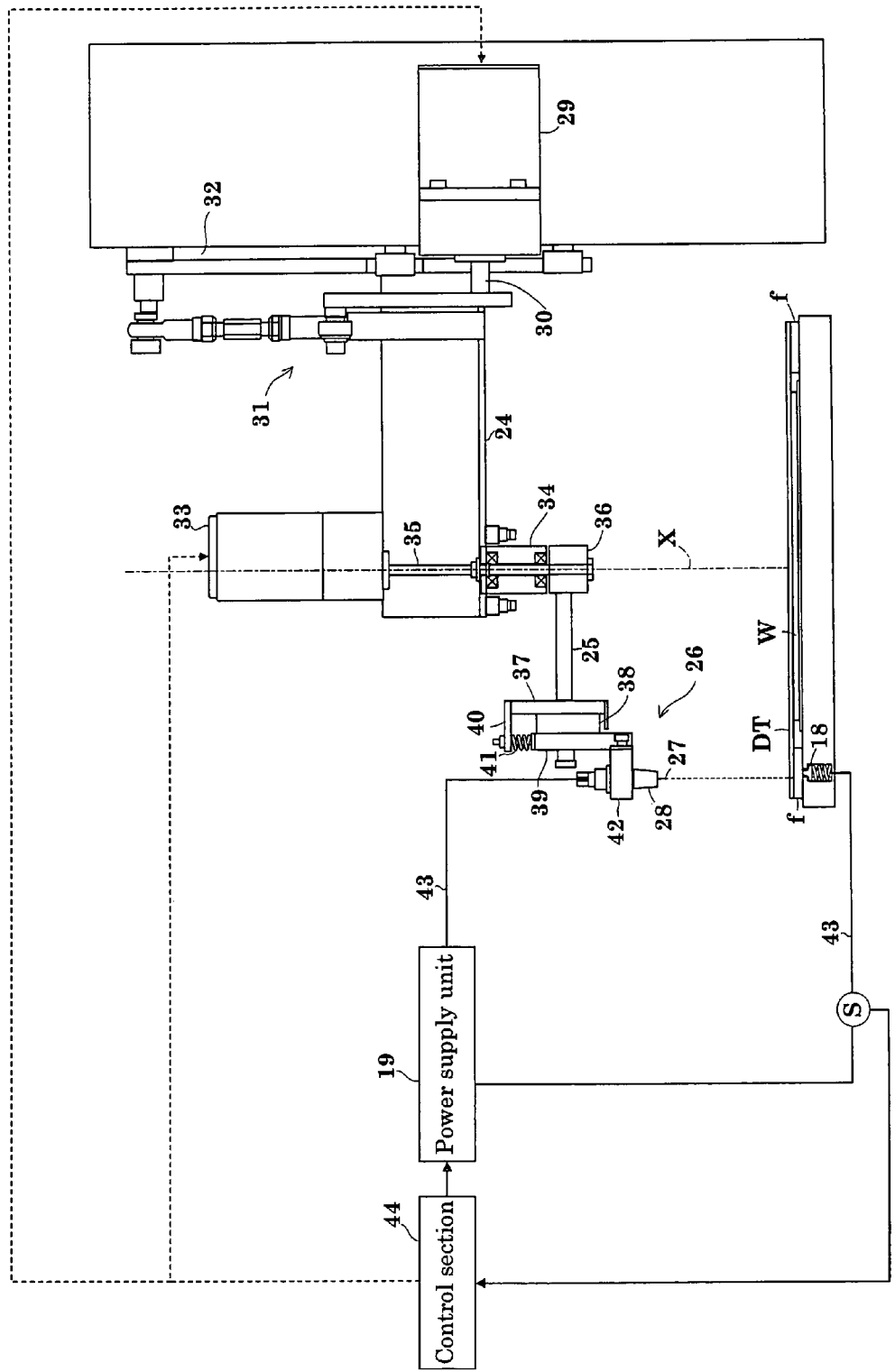
FIG. 2 is a side view illustrating main components of a tape cutting mechanism.

As illustrated in FIG. 2, the mount table 6 holds a ring frame f which is subjected to alignment on the alignment stage 5 and is transported by a movable bench, and suction holds a wafer W which is transferred by the first robot arm 2 to a center of an opening of the ring frame f. Herein, the ring frame f in this embodiment is made of an electrically conductive material such as metal. It is to be noted that the mount table 6 corresponds to frame holding means according to the present invention.

Moreover, an electrode 18 is embedded into the mount table 6 at a position where a ring frame f is placed. The electrode 18 comes into contact with a bottom side of the ring frame f by a spring force. In addition, the electrode 18 is connected to a power supply unit 19 (to be described later). It is to be noted that the power supply unit 19 corresponds to electric current feed means according to the present invention.

As illustrated in FIG. 1, the tape processing section 7 includes: the adhesive tape supply section 21 which unreels and supplies an adhesive tape DT from an original tape roll 20; the tape joining unit 22 which guides the adhesive tape DT above the mount table 6; and a tape cutting mechanism 23 which cuts the adhesive tape DT along a contour of a ring frame f. The tape collection section 8 collects an unnecessary portion of the cut adhesive tape DT. It is to be noted that the adhesive tape supply section 21 corresponds to tape supply means according to the present invention, and the tape joining unit 22 corresponds to joining means according to the present invention.

As illustrated in FIG. 2, the tape cutting mechanism 23 has the following structure. A pair of support arms 25 are provided in parallel on the movable bench 24 which can be driven to move vertically, so as to be driven to turn about a vertical axis center X positioned at a center of a ring frame f, and a cutter unit 26 is provided at a free end side of the support arm 25. The cutter unit 26 has a cutter blade 27 attached thereto through a cutter holder 28 in a state where a cutting edge of the cutter blade 27 is directed downward. Herein, the cutter blade 27 is made of an electrically conductive material such as metal. When the support arms 25 turn about the vertical axis center X, the cutter blade 27 travels along a tape joined side of a ring frame f to cut an adhesive tape DT. It is to be noted that the tape cutting mechanism 23 corresponds to a cutting mechanism according to the present invention, and the cutter blade 27 corresponds to a cutting member according to the present invention.

The movable bench 24 is coupled to a link mechanism 31 having three joints, and one end of the link mechanism 31 is coupled to a rotational shaft 30 of a motor 29. That is, when the motor 29 is driven to rotate in a forward/backward direction, the movable bench 24 moves vertically along a vertical rail 32. Further, a motor 33 is provided at a free end of the movable bench 24. A rotational shaft 35 of the motor 33 is coupled to a support member 36 through a bearing 34. The support arms 25 are supported by the support member 36 at a side end such that a sliding motion in a horizontal direction can be adjusted. By such an adjustment of the support arm 25, it is possible to change a distance from the cutter blade 27 to the rotational axis center X of the motor 29. In other words, it is possible to change and adjust a turning radius of the cutter blade 27 in response to a diameter of a ring frame f to be used.

A support bracket 37 is secured to the free end of the support arm 25. This support bracket 37 includes a unit movable bench 39 which allows the cutter unit 26 to slide along a vertical rail 38. A horizontal bracket 40 is attached to an end of the support bracket 37. The unit movable bench 39 and the horizontal bracket 40 are coupled to each other through a spring 41 such that the unit movable bench 39 is elastically biased in a direction that the cutter blade 27 moves downward.

Figure 4:
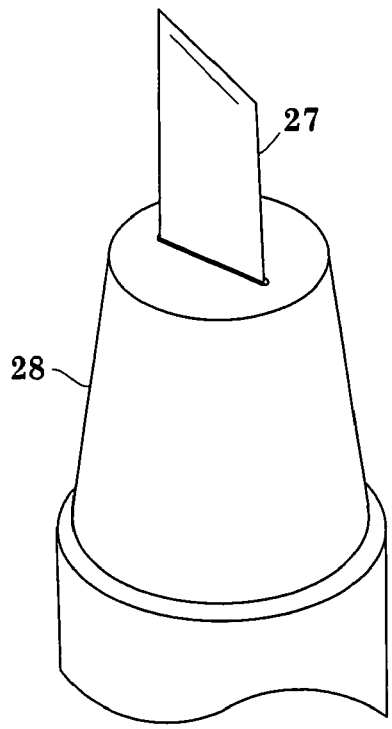
FIG. 4 is an enlarged view illustrating main components of the cutter blade.

The cutter holder 28 is attached to a bracket 42 which is coupled to one end of the unit movable bench 39. As illustrated in FIG. 4, the cutter blade 27 is attached to the tip end of the cutter holder 28. As illustrated in FIG. 2, the cutter blade 27 is connected with a lead wire 43 which passes through the cutter holder 28 from above via a slip ring, and electric current from the power supply unit 19 is fed to the cutter blade 27 through the lead wire 43.

As illustrated in FIG. 1, the second robot arm 9 is configured to advance/retreat horizontally and to turn. The second robot arm 9 suction holds a mount frame F obtained in such a manner that a wafer W and a ring frame f are integrated with each other through an adhesive tape DT in the mount table 6, and takes the mount frame F out of the mount table 6. Thereafter, the second robot arm 9 turns the mount frame F upside down such that a pattern face is directed upward, and turns to transport the mount frame F to the separation table.

The separation tape supply section 12 of the separation mechanism 11 unreels and supplies a separation tape Tp from an original tape roll such that the separation tape Tp passes above the separation table. That is, a separation roller R2 rolls on a surface of a protective tape P joined to a pattern face of a wafer W; thus, the separation tape Tp is joined to the protective tape P. Then, the separation tape Tp is separated together with the protective tape P. The separation tape Tp to be used herein has a width narrower than a diameter of the wafer W. It is to be noted that the separation mechanism 11 corresponds to separation means according to the present invention.

The character recognition unit 14 includes a CCD which scans a character such as a serial number inscribed on a wafer W, and a computer, which analyzes the scanned character.

The printer 15 newly converts a manufacturing management number into barcode data in response to the character recognized by the character recognition section 14, prints out a barcode label, and joins the barcode label to a mount frame F.

In the mount frame collection section 16, the cassette C2 houses mount frames F, each of which has been subjected to protective tape separation processing and has been provided with a barcode, in a state where an appropriate clearance is interposed between the housed mount frames F in a vertical direction. A cassette bench on which the cassette C is placed is also turnable by an air cylinder (not illustrated) so as to change a direction thereof.

Upon cutting an adhesive tape DT, a control section 44 adjusts a rotation speed of the motor 29 such that a force to press the cutter blade 27 against a ring frame f becomes stable, on the basis of a result of detection by a sensor S which detects in real time a conduction status of electric current fed from the power supply unit 19 to the cutter blade 27 and the electrode 18 embedded into the mount table 6.

Figure 3:
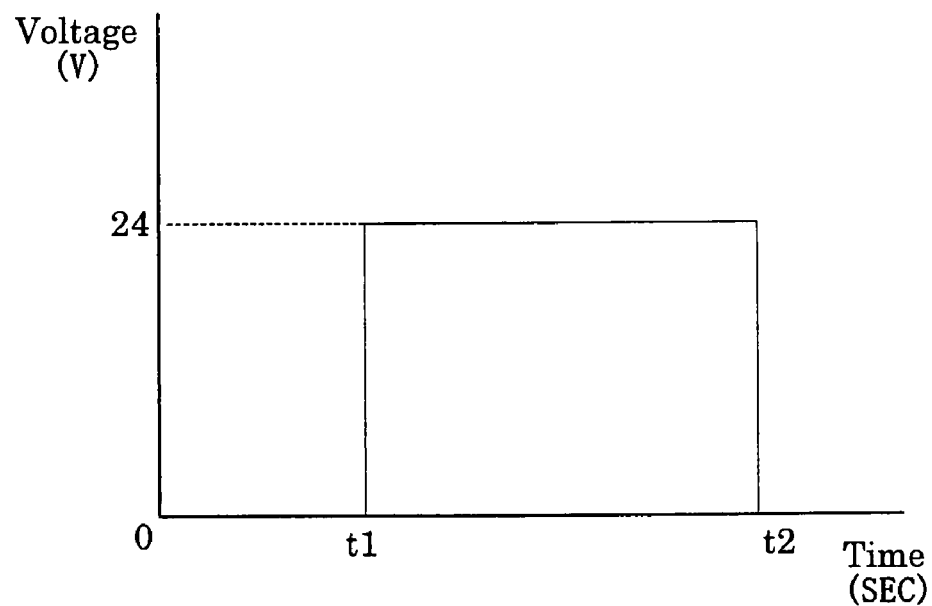
FIGS. 3A and 3B illustrate a conduction status and a non-conduction status as for a ring frame and a cutter blade at a time of cutting of an adhesive tape.
Figure 3:
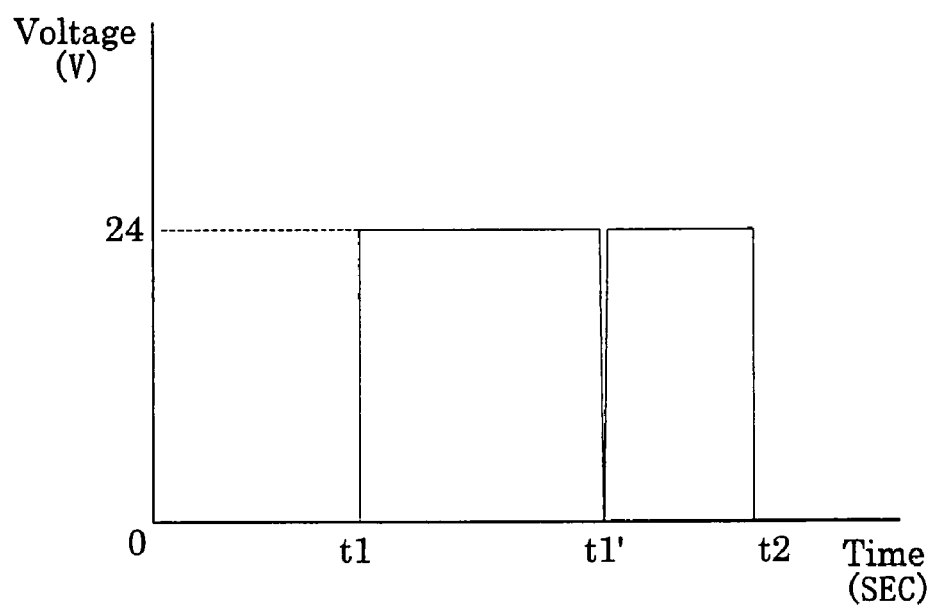
Figure 5:
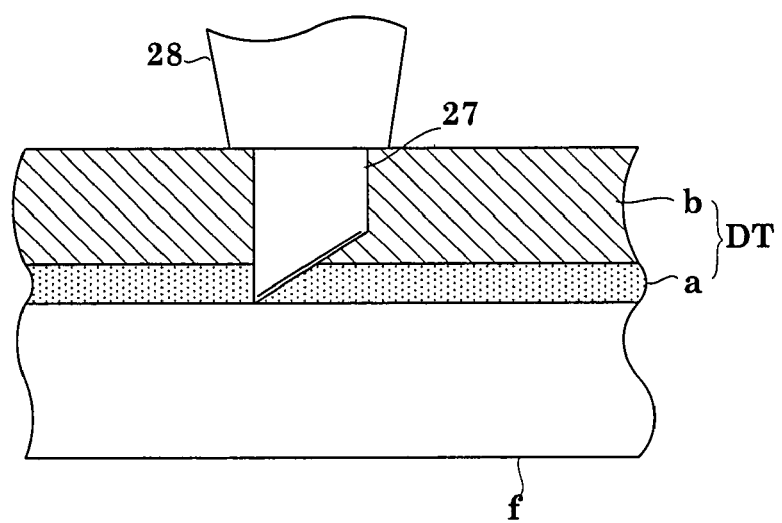
FIG. 5 is a sectional view illustrating a state where the adhesive tape is stuck with the cutter blade.

As illustrated in FIG. 5, more specifically, it is assumed herein that an adhesive tape DT is cut in a state where the cutting edge of the cutter blade 27 constantly comes into contact with a ring frame f. When electric current detected in a cutting period (t1 to t2) is converted into voltage, as illustrated in FIG. 3A, the voltage on a monitor takes a constant value of 24 V. If a wafer W is warped or the adhesive tape DT varies in thickness, however, the cutting edge of the cutter blade 27 does not penetrate the adhesive tape DT and, therefore, does not come into contact with the ring frame f. Herein, there occasionally occurs a cutting failure. As illustrated in FIG. 3B, in other words, the electrical conduction is disconnected at a time point t1' that the cutter blade 27 comes into non contact with the ring frame f during the cutting period (t1 to t2). Thus, the voltage on the monitor takes a value of 0 V. Upon detection of a start of a voltage drop phenomenon, accordingly, the control section 44 adjusts the rotating speed of the motor 29, which is predetermined based on data about correlation between the conduction status and the pressurized status of the cutter blade 27, to move the cutter blade 27 downward and to adjust a contact area with the ring frame f.

It is to be noted that the sensor S corresponds to detection means according to the present invention and the control section 44 corresponds to control means according to the present invention.

With reference to FIGS. 1 to 9, hereinafter, description will be given of basic steps in the aforementioned apparatus according to this embodiment.

First, the tip end of the first robot arm 2 is inserted between wafers W housed in the cassette C1 of the wafer supply section 1. Then, the first robot arm 2 suction holds a back face of the wafer W from above, takes the wafer W out of the wafer supply section 1, and transfers the wafer W to the alignment stage 4. Herein, the wafer W is subjected to alignment on the basis of an orientation flat or a notch thereof. Thereafter, the first robot arm 2 suction holds the back face of the wafer W again, and transfers the wafer W to the mount table 6.

Figure 6:
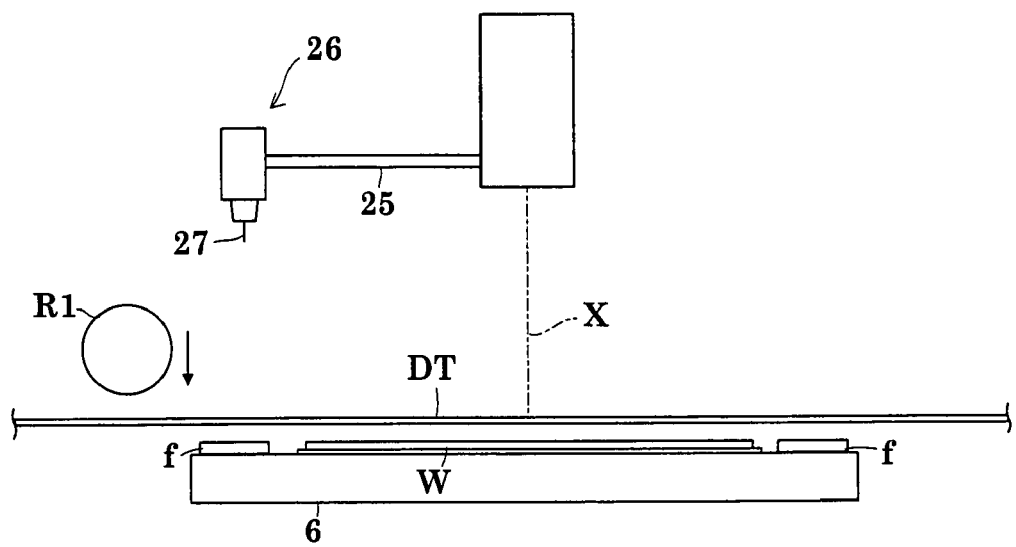
FIGS. 6 to 9 illustrate adhesive tape cutting operations performed by the apparatus according to the embodiment.

The mount table 6 includes a frame chuck section (not illustrated). A ring frame f, which has been subjected to alignment, is supplied from the alignment stage 5 to the frame chuck section, and the frame chuck section suction holds the ring frame f. Herein, the wafer W is placed on the mount table 6 so as to be positioned at a substantially center of the ring frame f, and then is suction held by the mount table 6. As illustrated in FIG. 6, herein, a joining roller R1 for an adhesive tape DT is situated on standby at a position backward the ring frame f.

Figure 7:
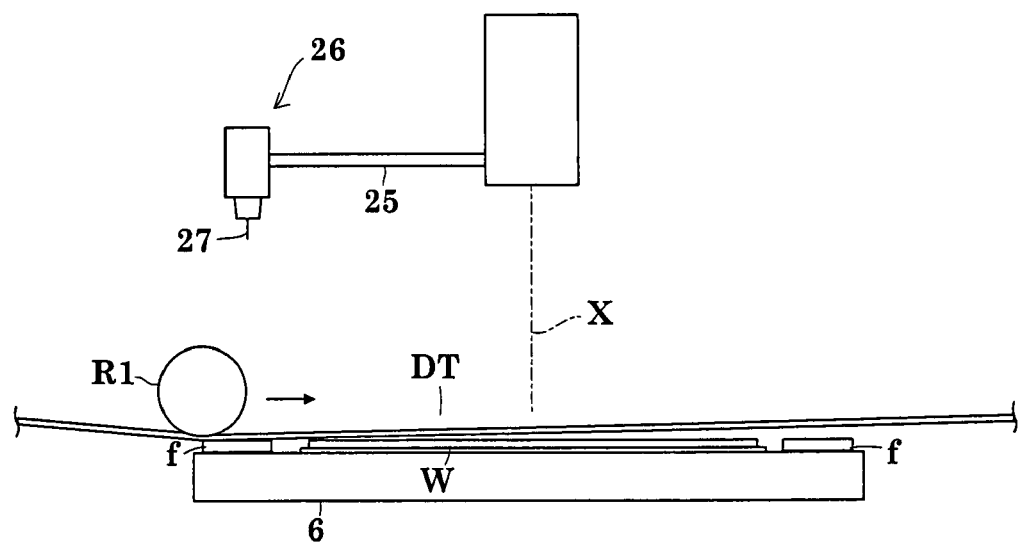
Figure 8:
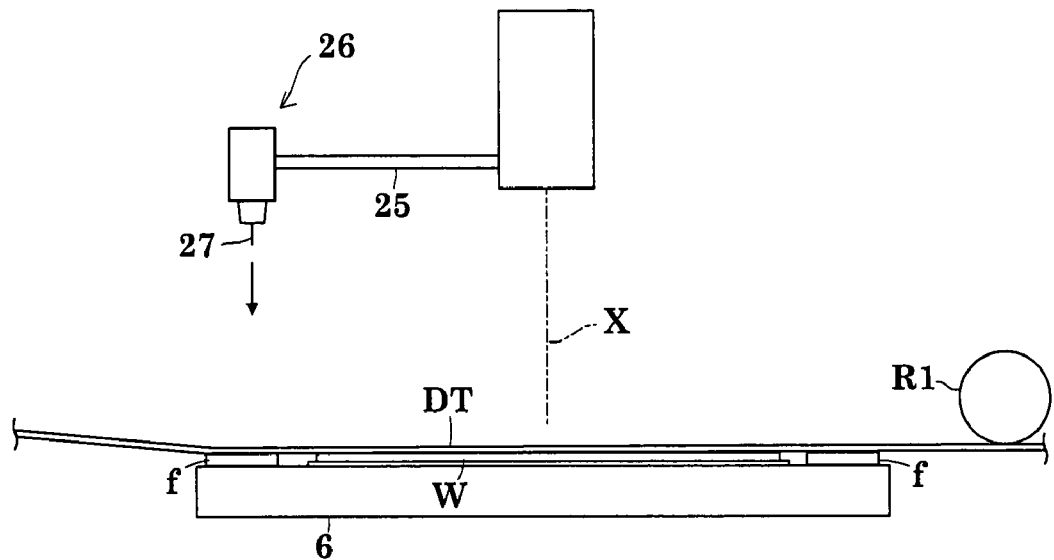
Figure 9:
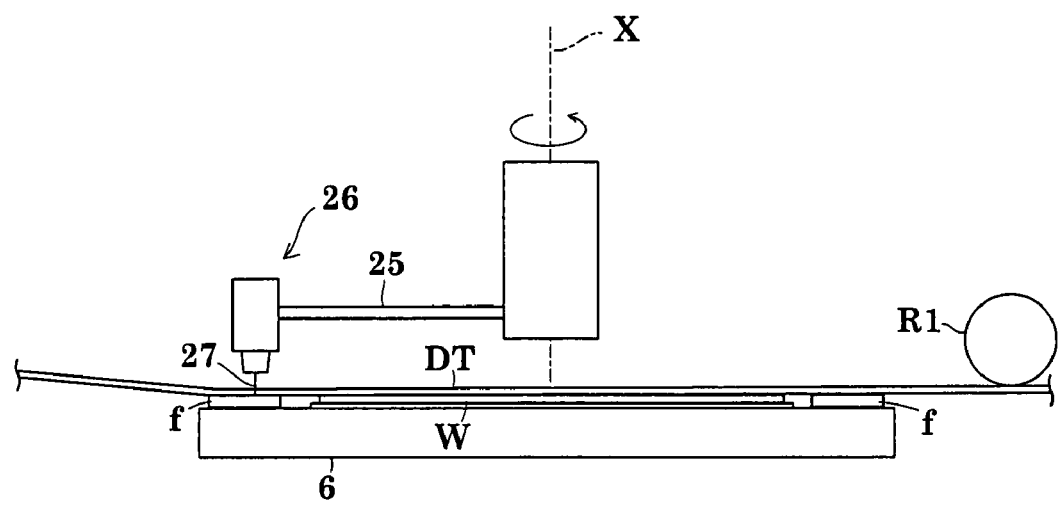

As illustrated in FIG. 7, next, the joining roller R1 moves downward to a non-adhesive surface of the adhesive tape DT. As illustrated in FIG. 8, then, the joining roller R1 rolls on the wafer W and ring frame f to join the adhesive tape DT to the wafer W and the ring frame f Thereafter, the tape cutting mechanism 23 is actuated, and allows the cutter unit 26 to move downward from a standby position toward an action position. As illustrated in FIG. 5, herein, the cutter blade 27 penetrates a base material b and an adhesive layer a of the adhesive tape DT, so that the tip end thereof comes into contact with the tape joined side of the ring frame f at a predetermined pressure. As illustrated in FIG. 9, in this state, the motor 29 is driven to rotate in order to rotate the support arm 25 about the vertical axis center X; thus, the adhesive tape DT is cut along a contour of the ring frame f.

In the step of cutting the adhesive tape DT, the power supply unit 19 feeds electric current to each of the cutter blade 27 and the electrode 18 embedded into the mount table 6 to establish a conduction status. Then, the sensor S detects this conduction status. Further, the control section 44 converts the electric current detected by the sensor S into voltage to monitor in real time variation of the voltage upon cutting of the adhesive tape. When the voltage drop is detected in this step, it is determined that a contact area with the cutter blade 27 is reduced. Then, the control unit 44 adjusts the rotation speed of the motor 29 so as to stabilize a force to press the cutter blade 27 against the ring frame f.

When the adhesive tape DT on the ring frame f is cut into a substantially circular shape, the cutter blade 27 returns to its standby position. Then, the separation unit 45 separates an unnecessary portion from the cut adhesive tape DT, and the tape collection section 8 reels and collects the unnecessary portion while the adhesive tape supply section 21 unreels and supplies a new adhesive tape DT.

A mount frame F obtained by integration of the ring frame f with the wafer W through the adhesive tape DT is discharged from the mount table 6. Then, the second robot arm 9 suction holds the mount frame F, and transports the mount frame F to the separation table. In this transportation step, the second robot arm 9 is turned; thus, the pattern face of the wafer W is directed upward.

The wafer W is transported to the separation table, and then is placed on a suction pad (not illustrated) at a predetermined position in a predetermined posture. Thus, the suction pad suction holds the wafer W in a state where a pattern face to which a protective tape P is joined is directed upward. Herein, the separation roller R2 is at a standby position spaced away from the separation table.

When the mount frame F is placed on the separation table, the separation roller R2 rolls on the wafer W, so that the separation tape Tp is joined to the surface of the protective tape P while the protective tape P is separated from the front face of the wafer W together with the separation tape Tp. Herein, the separation tape supply section 12 appropriately supplies the separation tape Tp and the tape collection section 13 reels and collects the protective tape P separated together with the separation tape Tp.

Next, a transportation bench transports to the character recognition section 14 the wafer W from which the protective tape P is separated by the separation tape Tp. The character recognition section 14 performs processing for recognizing a serial number printed on the wafer W. Then, the printer 15 newly produces a barcode label of a manufacturing management number, and joins the barcode label to the mount frame F.

After completion of the processing for joining the barcode label, the transportation bench transports the mount frame F to the cassette C2.

The configuration of the mount process is not limited to that described in this embodiment.

As described above, in order to cut the strip-shaped adhesive tape DT along the contour of the ring frame f, electric current is fed to each of the ring frame f and the cutter blade 27 by the contact of the cutter blade 27 with the ring frame f, and a conduction status herein is monitored. Thus, it is possible to readily detect a conduction status in which the cutter blade 27 penetrates the adhesive tape DT and comes into contact with the ring frame f and a non-conduction status in which the cutter blade 27 does not penetrate the adhesive tape DT. In other words, it is possible to detect the conduction status in which the adhesive tape DT is cut completely and the non-conduction status in which there occurs a cutting failure that the adhesive tape DT is not cut completely. On the basis of the result of the real-time detection by sensor S, the force to press the cutter blade 27 against the ring frame f is adjusted immediately, so that it is possible to suppress the occurrence of the cutting failure about the adhesive tape DT.

The present invention is not limited to the aforementioned embodiment, and may be modified variously as follows.

(1) In the foregoing embodiment, the side of the ring frame f, to which the adhesive tape DT is joined, is directed downward. Alternatively, such a side may be turned upside down upon performance of joining, cutting and separating of the adhesive tape DT.

(2) In the foregoing embodiment, the link mechanism 31 allows the cutter unit 26 to move upward/downward. Alternatively, the movable bench 24 may move upward/downward along a ball shaft coupled to a motor.

(3) In the foregoing embodiment, the cutting edge of the cutter blade 27 is sharp. Alternatively, the cutter blade 27 may be formed into a circular shape so as to be rotatably held. In this case, electrical conduction may be established through a ball bearing for the circular cutter blade.

(4) In the foregoing embodiment, the sensor S detects the voltage drop and, concurrently, the control section 44 adjusts the force to press the cutter blade 27 to cut the adhesive tape DT. Alternatively, the adhesive tape DT may be cut as follows.

In a case where the cutter blade 27 is tapered toward its tip end, for example, a sensor such as a rotary encoder detects an angle of rotation of the cutter blade 27 upon cutting of the adhesive tape DT, and storage means such as a memory stores the information about the cutting position while bringing the information into correspondence with a voltage status sequentially detected by the sensor S.

When the sensor S detects the voltage drop, the position of the voltage drop is read from the storage means after completion of the turning operation of the cutter blade 27. Thereafter, the cutter blade 27 is moved to this position where the adhesive tape DT is stuck with the cutter blade 27 and is cut by a predetermined distance, preferably, about a few millimeters after detection of the voltage drop.

If the cutting member is a cutter formed into a circular shape, the adhesive tape DT may be cut as follows. Firstly, after the completion of the turning operation of the cutter blade, the cutter blade is moved to the position of the voltage drop as described above, and then cuts the adhesive tape again.

Secondly, when the sensor S detects the voltage drop, the control section 44 allows the motor 29 to rotate in a reverse direction at this time so as to retreat the cutter blade by a distance exceeding the position where the voltage drop is detected. Then, the control section 44 allows the motor 29 to rotate in a normal direction to complete the turning of the cutter blade.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for cutting a supporting adhesive tape of insulating materials allowing a ring frame to hold a semiconductor wafer, the apparatus comprising:
   a frame holding mechanism for holding a ring frame;
   a tape supply mechanism for supplying a strip-shaped supporting adhesive tape toward the ring frame;
   a joining mechanism for pressing a joining member against a non-adhesive surface of the adhesive tape, allowing the holding means and the joining member to move relatively, and joining the adhesive tape to the ring frame;
   a cutting mechanism including a cutting member having a sharp tip end, and cutting the adhesive tape along a contour of the ring frame while bringing the cutting member penetrating the adhesive tape into contact with the ring frame;
   an electric current feed unit for feeding electric current to the ring frame via the cutting member upon cutting of the adhesive tape so as to establish electrical conduction when the cutting member comes into contact with the ring frame;
   a sensor for detecting a conduction failure that occurs in lost of contact between the cutting member and the ring frame upon cutting of the adhesive tape; and
   a separation mechanism for separating an unnecessary portion of the cut adhesive tape.

2. The apparatus of claim 1, wherein
   the sensor detects variation in voltage,
   the apparatus further comprising:
   a control unit, when the sensor detects the variation in voltage, for adjusting a force to press the cutting member against the adhesive tape so as to stabilize the detected voltage.

3. The apparatus of claim 2, further comprising:
   a sensor for detecting a position to he cut by the cutting member upon cutting of the adhesive tape; and
   a storage unit for storing information about the position detected by the sensor and information about the variation in voltage detected by the sensor while bringing these pieces of information into correspondence with each other, wherein
   when the sensor detects the variation in voltage, the control unit reads from the storage unit a cutting position at the variation in voltage, and allows the cutting member to press the adhesive tape and to move again at the cutting position.

4. The apparatus of claim 3, wherein
   the cutting member is a cutter blade tapered toward a tip end.

* * * * *